(12) United States Patent
Matsumoto

(10) Patent No.: US 7,612,597 B2
(45) Date of Patent: Nov. 3, 2009

(54) ELECTRONIC CIRCUIT

(75) Inventor: Shuuji Matsumoto, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 2 days.

(21) Appl. No.: 11/847,871

(22) Filed: Aug. 30, 2007

(65) Prior Publication Data
US 2008/0054977 A1   Mar. 6, 2008

(30) Foreign Application Priority Data
Sep. 4, 2006   (JP) .............................. 2006-238744

(51) Int. Cl.
*G06F 1/04* (2006.01)
*H03K 3/00* (2006.01)
(52) U.S. Cl. .................. 327/291; 327/293; 327/294; 327/298; 327/299
(58) Field of Classification Search .................. 327/165, 327/166, 291–299
See application file for complete search history.

(56) References Cited

U.S. PATENT DOCUMENTS 6,438,703 B1 *   8/2002   Berning et al. .............. 713/401
7,342,430 B1 *   3/2008   Chiang ........................ 327/295
2002/0186065 A1 * 12/2002   Lammers ..................... 327/291

FOREIGN PATENT DOCUMENTS

JP   11-274905   10/1999

* cited by examiner

*Primary Examiner*—Lincoln Donovan
*Assistant Examiner*—Brandon S Cole
(74) *Attorney, Agent, or Firm*—Oblon, Spivak, McClelland, Maier & Neustadt, L.L.P.

(57) ABSTRACT

An electronic circuit for performing clock gating on a clock signal supplied to a clock system using both edges, has a non-inverted/inverted signal selector which has an input connected to an input terminal, is fed with the clock signal through the input terminal, and outputs a first signal obtained by non-inverting or inverting the clock signal in response to a control signal; a signal latch which has an input connected to an output of the non-inverted/inverted signal selector, outputs the inputted first signal as a second signal through an output terminal, and latches a state of the second signal in response to an enable signal inputted through an enable terminal; and an input/output comparator which compares the clock signal and the second signal and outputs the control signal to the non-inverted/inverted signal selector such that the first signal agrees with the second signal.

4 Claims, 4 Drawing Sheets

ELECTRONIC CIRCUIT

CROSS-REFERENCE TO RELATED APPLICATION

This application is based upon and claims the benefit of priority from the prior Japanese Patent Application No. 2006-238744, filed on Sep. 4, 2006, the entire contents of which are incorporated herein by reference.

BACKGROUND OF THE INVENTION

1. Field of the Invention

The present invention relates to an electronic circuit for performing clock gating on a clock signal supplied to a clock system in which both edges of the signal are used.

2. Background Art

Conventionally, in some cases, flip-flops and memories for capturing data on both edges of clocks are used in semiconductor integrated circuits. Such flip-flops and memories for capturing data on both edges of clocks can achieve not only higher clock speeds but also a reduction in the charge and discharge of clock systems by half. Thus such flip-flops and memories have been used for low-power LSIs.

One of basic power-saving techniques is clock gating. Clock gating is a technique for temporarily stopping the transmission of clocks to circuits when the circuit sections do not need to operate in semiconductor integrated circuits. The clock gating technique can reduce excessive current consumption.

For example, in a period during which the supply of an output clock signal is stopped, a conventional electronic circuit (a gate circuit for clocks) for performing clock gating latches a state of the output clock signal when the supply of the output clock signal is stopped, and outputs the signal to a flip-flop circuit. When the supply of the output clock signal is resumed, the output clock signal is outputted to the flip-flop circuit in phase or in opposite phase with an input clock signal such that the state of the output clock signal when the supply of the output clock signal is stopped agrees with the state of the input clock signal when the supply of the output clock signal is resumed. Thus it is possible to prevent the occurrence of an excessive edge on the output clock signal (see Japanese Patent Laid-Open Publication No. 11-274905).

By using flip-flops and memories in which data is captured on both of the rising edge and the falling edge of a clock as described in the related art, the clock frequency (operating frequency) can be increased as compared with ordinary flip-flops and memories in which data is captured only on the rising edge (or the falling edge). Therefore, such flip-flops and memories have been used for high-speed LSIs.

Furthermore, since the charge and discharge of a clock system can be reduced by half using both edges of a clock, such a technique is also used for low-power LSIs.

However, the electronic circuit of the related art requires at least two exclusive-OR circuits and two latch circuits, resulting in a complicated circuit configuration and an increase in circuit area.

SUMMARY OF THE INVENTION

According one aspect of the present invention, there is provided: an electronic circuit for performing clock gating on a clock signal supplied to a clock system using both edges, comprising a non-inverted/inverted signal selector which has an input connected to an input terminal, is fed with the clock signal through the input terminal, and outputs a first signal obtained by non-inverting or inverting the clock signal in response to a control signal; a signal latch which has an input connected to an output of the non-inverted/inverted signal selector, outputs the inputted first signal as a second signal through an output terminal, and latches a state of the second signal in response to an enable signal inputted through an enable terminal; and an input/output comparator which compares the clock signal and the second signal and outputs the control signal to the non-inverted/inverted signal selector such that the first signal agrees with the second signal.

DETAILED DESCRIPTION

An electronic circuit (clock gating circuit) according to an aspect of the present invention performs clock gating on a clock signal supplied to a clock system in which both edges of the signal are used. The electronic circuit makes it possible to easily suppress only a transition of a given edge to be stopped and thus supply a desired clock signal to the clock system.

Exemplary embodiments of the present invention will now be described with reference to the accompanying drawings.

FIRST EMBODIMENT

Figure 1:
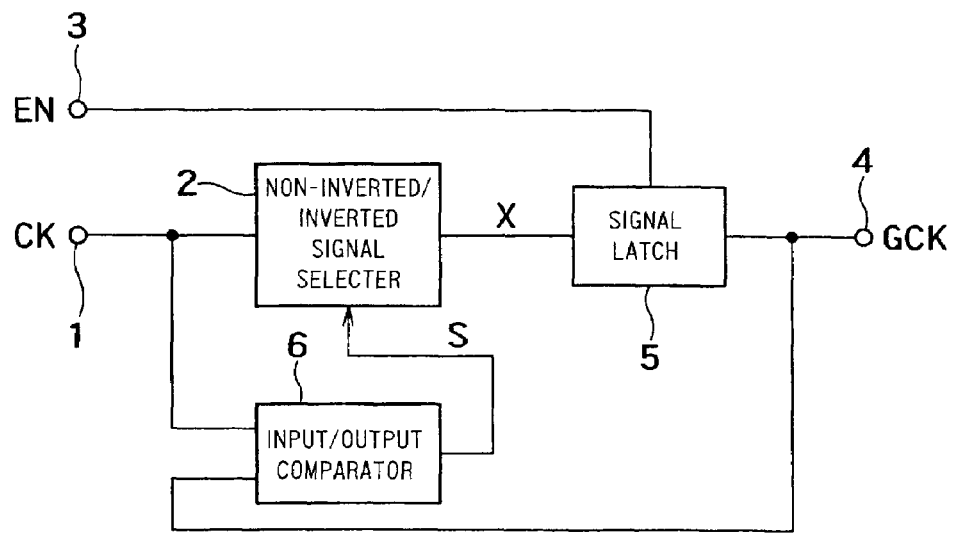
FIG. 1 is a block diagram showing the main configuration of an electronic circuit 100 according to a first embodiment, which is an aspect of the present invention.

FIG. 1 is a block diagram showing the main configuration of an electronic circuit according to a first Embodiment, which is an aspect of the present invention.

As shown in FIG. 1, an electronic circuit 100 includes a non-inverted/inverted signal selector 2 which has an input connected to an input terminal 1, is fed with a clock signal (input signal) CK through the input terminal 1, and outputs a first signal X obtained by non-inverting or inverting the clock signal CK in response to a control signal S, a signal latch 5 which has an input connected to the output of the non-inverted/inverted signal selector 2, outputs the inputted first signal X as a second signal (output signal) GCK through an output terminal 4, and latches a state of the second signal GCK in response to an enable signal EN inputted through an enable terminal 3, and an input/output comparator 6 which compares the clock signal CK and the second signal GCK and outputs the control signal S to the non-inverted/inverted signal selector 2 such that the first signal X agrees with the second signal GCK.

The non-inverted/inverted signal selector 2 is fed with the clock signal CK, selects one of the non-inverted signal and the inverted signal of the clock signal (input signal) CK in response to the control signal S from the input/output comparator 6, and outputs the selected signal as the first signal X.

For example, the signal latch 5 latches, when the enable signal EN is "Low", the state of the second signal (output signal) GCK outputted at a moment when the enable signal EN changes from "High" to "Low". When the enable signal EN is "High", the signal latch 5 transmits the first signal X of the non-inverted/inverted signal selector 2 as the second signal GCK as it is to the output terminal 4.

The input/output comparator 6 compares, as described above, the clock signal CK and the output signal GCK and outputs the control signal S such that the output signal GCK agrees with the first signal X (the signal X is "High" when the output GCK is "High", and the signal X is "Low" when the output GCK is "Low").

Figure 2:
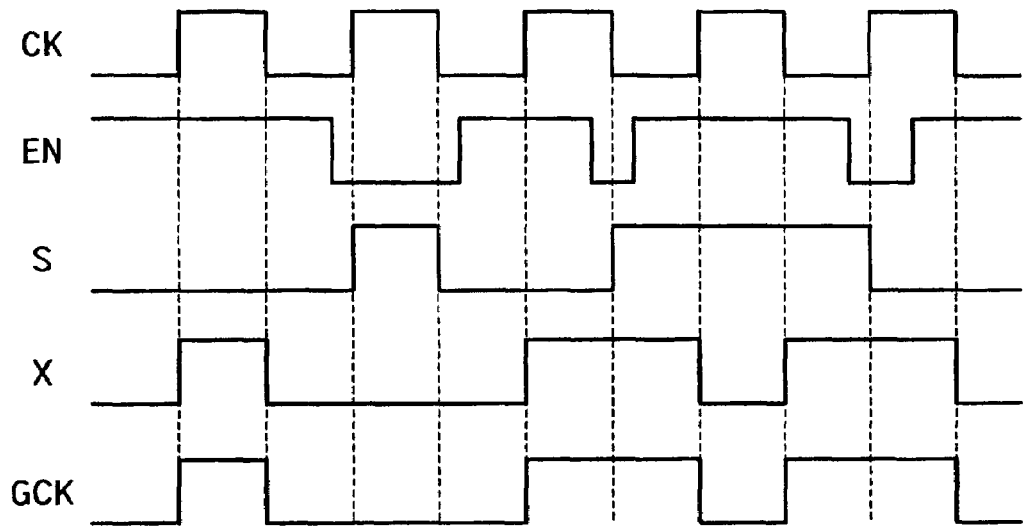
FIG. 2 is a timing chart showing an example of an ideal operation of the electronic circuit 100 according to the first embodiment of the present invention.

The operations of the electronic circuit 100 configured thus will be described below. FIG. 2 is a timing chart showing an example of an ideal operation of the electronic circuit 100 according to the first embodiment of the present invention.

1) As shown in FIG. 2, first, when the enable signal EN is "High", the signal latch 5 does not latch the output signal GCK but transmits the output X of the non-inverted/inverted signal selector 2 to the output GCK.

Furthermore, the non-inverted/inverted signal selector 2 outputs the non-inverted or inverted clock signal CK, which agrees with the output GCK, as the first signal X in response to the control signal S from the input/output comparator 6, and the first signal X acts as the second signal (output signal) GCK as it is.

In a period during which the enable signal EN is "High", the non-inverted or inverted clock signal CK selected in response to the control signal S acts as the output of the output signal GCK as it is.

2) Next, when the enable signal EN changes from "High" to "Low", the signal latch 5 latches the second signal GCK at the transition of the enable signal EN from "High" to "Low". Even when the clock signal CK changes, the signal latch 5 holds the fixed state of the second signal (output signal) GCK.

Also in a period during which the output terminal 4 keeps outputting a constant value, the input/output comparator 6 changes the control signal S such that the clock signal CK and the second signal (output signal) GCK agree with each other, and the first signal X outputted from the non-inverted/inverted signal selector 2 agrees with the second signal (output signal) GCK.

3) Next, when the enable signal EN changes from "Low" to "High", the signal latch 5 does not latch the state of the second signal (output signal) GCK but transmits the first signal X of the non-inverted/inverted signal selector 2 to the output terminal 4. However, since the first signal X and the second signal (output signal) GCK agree with each other (the signal X is "High" when the output GCK is "High", and the signal X is "Low" when the output GCK is "Low"), the value does not immediately change.

After the enable signal EN changes to "High", the electronic circuit 100 returns to 1) and repeats the operation.

With the electronic circuit 100 performing the above operations, it is possible to suppress only an edge to be removed on the clock signal CK. Thus it is possible to achieve an expected gating clock also in a clock system using a double edged memory, in which data transition on both of the rising edge and the falling edge is significant.

As described above, the electronic circuit of the present embodiment can perform clock gating corresponding to both edges of a clock.

SECOND EMBODIMENT

In the first embodiment, each configuration was described in accordance with the block diagram. The present embodiment will describe an example in which a specific configuration is applied to each block.

Figure 3:
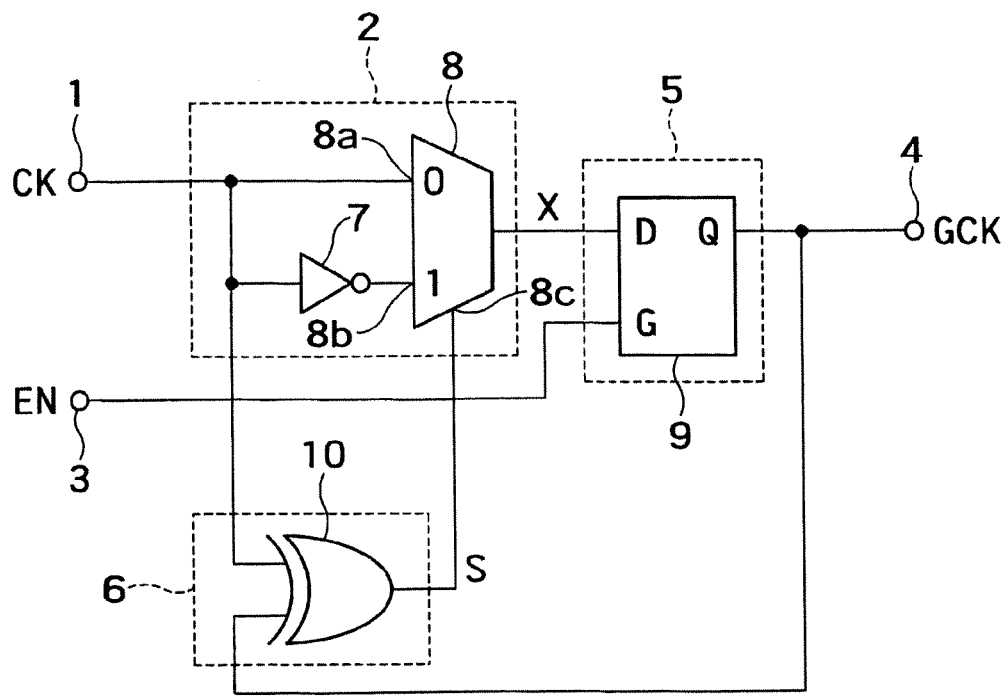
FIG. 3 is a circuit diagram showing the main configuration of an electronic circuit 200 according to a second embodiment, which is an aspect of the present invention.

FIG. 3 is a circuit diagram showing the main configuration of an electronic circuit 200 according to a second embodiment, which is an aspect of the present invention. The configurations indicated by the same reference numerals as the first embodiment are similar to those of the first embodiment.

As shown in FIG. 3, a non-inverted/inverted signal selector 2 includes an inverter 7 which has an input connected to an input terminal 1 and a multiplexer 8 which has a first input 8a connected to the input terminal 1 and a second input 8b connected to the output of the inverter 7, switches signals inputted to the first input 8a and the second input 8b in response to a control signal S inputted to a selecting/input terminal 8c, and outputs a first signal X.

A signal latch 5 includes a latch circuit 9 having a D input connected to the output of the multiplexer 8 and a G input connected to an enable terminal 3.

The latch circuit 9 outputs the inputted first signal X as a second signal GCK through an output terminal, and latches a state of the second signal (output signal) GCK in response to the input of an enable signal EN.

The input/output comparator 6 includes an exclusive-OR circuit 10 which has one input connected to the input terminal 1, the other input connected to an output terminal 4, and an output connected to the selecting/input terminal 8c of the multiplexer 8.

The exclusive-OR circuit 10 compares a clock signal (input signal) CK and the second signal (output signal) GCK and outputs the control signal S such that the first signal X agrees with the second signal GCK.

The operations of the electronic circuit 200 configured thus will be described below. A timing chart showing an example of an ideal operation of the electronic circuit according to the second embodiment of the present invention is similar to FIG. 2 of the first embodiment.

1) As shown in FIG. 2, first, when the enable signal EN is "High", the latch circuit 9 transmits the first signal X, which is outputted from the multiplexer 8, to the output terminal 4 as the second signal (output signal) GCK.

When the second signal (output signal) GCK is "Low", the control signal S outputted from the exclusive-OR circuit 10 is set at "Low" in response to the input of "Low" to the clock signal CK, and the first input (non-inverted ("0")) 8a is selected in the multiplexer 8 to set the first signal X at "Low", so that the second signal (output signal) GCK is kept at "Low".

When the clock signal CK is "High", the first signal X is set at "High" before the control signal S outputted from the exclusive-OR circuit 10 changes, so that the second signal GCK is "High".

When the enable signal EN is "High", the electronic circuit 200 outputs the clock signal CK as the output signal GCK.

2) Next, when the enable signal EN changes from "High" to "Low", the latch circuit 9 latches the state of the second signal (output signal) GCK at the transition of the enable signal EN from "High" to "Low".

Thus when the enable signal EN is "Low", the electronic circuit 200 keeps the state of the output signal GCK even in the event of a change of the clock signal CK.

Also when the output signal GCK has a constant value, the exclusive-OR circuit 10 changes the control signal S such that the clock signal CK and the output signal GCK agree with each other. Thus the first signal X outputted from the multiplexer 8 is controlled so as to agree with the output signal GCK.

3) Next, when the enable signal EN changes from "Low" to "High", the latch circuit 9 does not latch the state of the second signal (output signal) GCK at that time but transmits the first signal X, which is outputted from the multiplexer 8, to the output terminal 4 as the second signal (output signal) GCK. However, as described above, the multiplexer 8 is controlled by the control signal S outputted from the exclusive-OR circuit 10 and the first signal X and the second signal (output signal) GCK are in phase with each other. In other words, when the second signal (output signal) GCK is "High", the first signal X is "High", and when the second signal (output signal) GCK is "Low", the first signal X is "Low".

Thus even when the enable signal EN changes from "Low" to "High", the electronic circuit 200 does not immediately change the output signal GCK.

After the enable signal EN changes to "High", the electronic circuit 200 returns to 1) and repeats the operations.

As described above, when the clock signal CK and the enable signal EN are inputted to the electronic circuit 200, the output signal GCK meeting expectations can be obtained by clock gating as shown in FIG. 2.

In this way, it is possible to suppress only an edge to be removed on the clock signal CK and achieve an expected gating clock also in a clock system using a double edged memory, in which data transition on both of the rising edge and the falling edge is significant.

In the electronic circuit 200, the non-inverted/inverted signal selector 2 and the signal latch 5 act as a path for outputting, to the output terminal 4, the clock signal (input signal) CK inputted from the input terminal 1. When the non-inverted/inverted signal selector 2 and the signal latch 5 are slow circuits, the delay of the electronic circuit 200 may increase. Thus it is preferable that the non-inverted/inverted signal selector 2 and the signal latch 5 are high-speed circuits. In contrast, the input/output comparator 6 cannot be too fast or too slow, and thus consideration should be given to the timing.

The following will discuss a restriction on the speed of the input/output comparator 6 and a restriction on the timing of the enable signal EN and the input signal CK.

Figure 4:
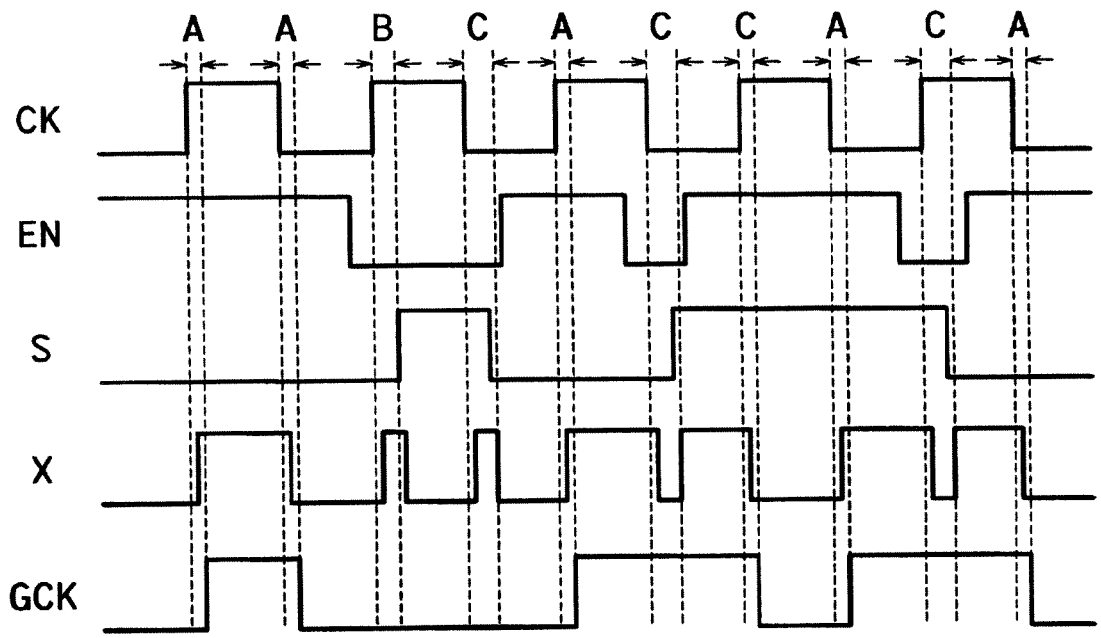
FIG. 4 is a timing chart showing an example of operations performed in consideration of the circuit delay of the electronic circuit 200 according to the second embodiment of the present invention.

FIG. 4 is a timing chart showing an example of operations performed in consideration of the circuit delay of the electronic circuit 200 according to the second embodiment of the present invention.

As described above, when the enable signal EN is "High", the electronic circuit 200 outputs the input signal CK to the output terminal 4 as the output signal GCK. At this moment, the output signal GCK is delayed from the input signal CK by the circuit delay of the non-inverted/inverted signal selector 2 and the signal latch 5 (A in FIG. 4). The control signal S should not be changed at this moment by the input/output comparator 6 for comparing the input signal CK and the output signal GCK and outputting the control signal S. Thus the processing speed of the input/output comparator 6 has to be lower than the circuit delay of the non-inverted/inverted signal selector 2 and the signal latch 5.

In the case where the processing speed of the input/output comparator 6 is higher than the circuit delay of the non-inverted/inverted signal selector 2 and the signal latch 5, only the control signal S is switched even when the input signal CK does not change. Hence, regardless of the clock signal CK, the first signal X switches between "High" and "Low" in synchronization with the control signal S. Accordingly, when the enable signal EN is "High", the output signal GCK switches between "High" and "Low". As a result, the output signal GCK may change and oscillate regardless of the input signal CK.

Next, at a moment when the enable signal EN switches from "High" to "Low", that is, when the output signal GCK is latched, the signal latch 5 can latch the output signal GCK even when the output signal GCK changes immediately before (or concurrently with) the change of the input signal CK (B in FIG. 4).

The following will examine a moment when the enable signal EN switches from "Low" to "High", that is, a return to a state in which the output signal GCK is outputted in synchronization with an edge of the input signal CK. In this case, the input/output comparator 6 has to decide that the first signal X (selected in response to the control signal S) and the output signal GCK do not agree with each other, change the control signal S, and cause the first signal X and the output signal GCK to agree with each other before the enable signal EN is changed (C in FIG. 4).

When the enable signal EN is changed before this operation, the output signal GCK has an excessive signal change (edge). Furthermore, when the input/output comparator 6 is too slow, the time when the enable signal EN may be changed from the edge of the input signal CK is delayed, resulting in inapplicability to high-speed circuits.

As described above, the input/output comparator 6 cannot be too fast or too slow. Moreover, the timing is restricted between the clock signal CK and the enable signal EN. In consideration of the restriction on the timing, it is necessary to adjust the size and the threshold value of the electronic circuit (clock gating circuit) 200 and set the timing of the input signal CK and the enable signal EN in a timing library.

As described above, the electronic circuit of the present embodiment can perform clock gating corresponding to both edges of a clock as in the first embodiment. Particularly as compared with the related art, it is possible to reduce the latch circuit and the exclusive-OR circuit, achieving a simple circuit.

THIRD EMBODIMENT

The second embodiment described an example in which a specific configuration is applied to each block.

The present embodiment will describe another example in which a specific circuit configuration is applied to each block.

Figure 5:
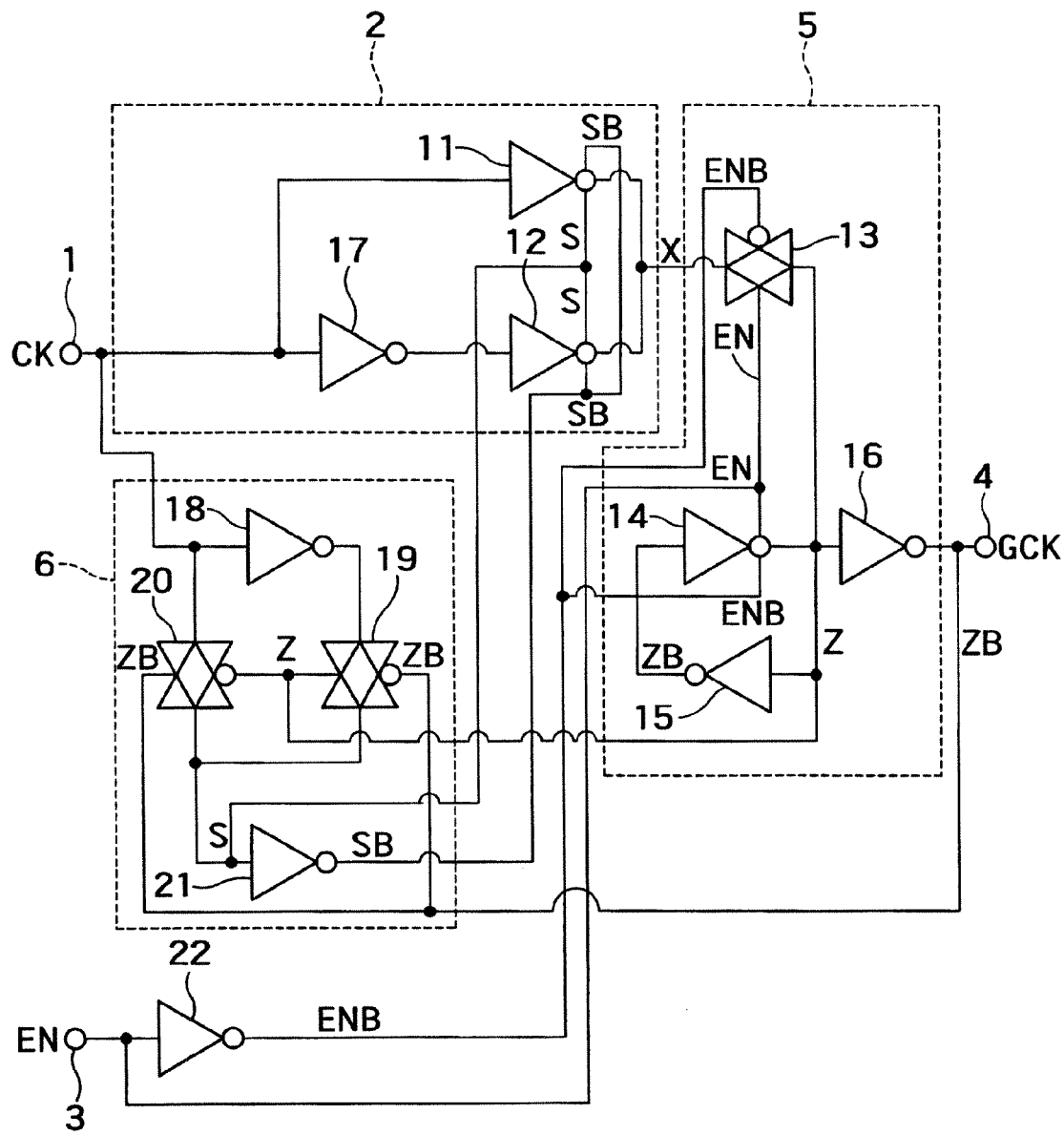
FIG. 5 is a circuit diagram showing the main configuration of an electronic circuit 300 according to a third embodiment, which is an aspect of the present invention.

FIG. 5 is a circuit diagram showing the main configuration of an electronic circuit 300 according to a third embodiment, which is an aspect of the present invention. The configurations indicated by the same reference numerals as the first and second embodiments are similar to those of the first and second embodiments.

As shown in FIG. 5, a non-inverted/inverted signal selector 2 includes a first inverter 17 which has an input connected to an input terminal 1, a first clocked inverter 11 which has an input connected to the input terminal 1 and an output connected to the input of a signal latch 5, operates in response to a control signal S and a signal SB obtained by inverting the control signal S, and outputs a first signal X, and a second clocked inverter 12 which has an input connected to the output of the first inverter 17 and an output connected to the output of the first clocked inverter 11, operates in an opposite way from the first clocked inverter 11 in response to the control signal S and the signal SB obtained by inverting the control signal S, and outputs the first signal X.

The signal latch 5 includes a first transfer gate 13 which has an end connected to the output of the first clocked inverter 11 and operates in response to an enable signal EN and a signal ENB obtained by inverting the enable signal EN, and a second inverter 15 having an input connected to the other end of the first transfer gate 13.

Furthermore, the signal latch 5 includes a third clocked inverter 14 which has an input connected to the output of the second inverter 15 and an output connected to the input of the second inverter 15 and operates in an opposite way from the first transfer gate 13 in response to the enable signal EN and the signal ENB obtained by inverting the enable signal EN, and a third inverter 16 which has an input connected to the output of the third clocked inverter 14 and the other end of the first transfer gate 13 and an output connected to an output terminal 4.

An input/output comparator 6 includes a fourth inverter 18 having an input connected to the input terminal 1, and a second transfer gate 19 which has an end connected to the output of the fourth inverter 18, operates in response to a second signal (output signal) GCK (ZB) and a signal Z obtained by inverting the second signal GCK (ZB), and outputs the control signal S.

Furthermore, the input/output comparator 6 includes a third transfer gate 20 which has an end connected to the input terminal 1, operates in an opposite way from the second transfer gate 19 in response to the second signal ZB and the signal Z obtained by inverting the second signal ZB, and outputs the control signal S, and a fifth inverter 21 which has an input connected to the other end of the second transfer gate 19 and the other end of the third transfer gate 20 and outputs the signal SB obtained by inverting the control signal S.

Furthermore, the electronic circuit 300 includes a sixth inverter 22 for inverting the enable signal EN and outputting the signal ENB.

In this configuration, the third clocked inverter 14 and the second inverter 15 make up a latch circuit.

The third clocked inverter 14 is turned on to latch the value (latch operation) when the enable signal EN is "Low" (the signal ENB is "High").

Conversely, when the enable signal EN is "High" (the signal ENB is "Low"), the first transfer gate 13 is turned on to pass, as the signal Z, the first signal X outputted from the first clocked inverter 11 or the second clocked inverter 12.

The second clocked inverter 12 is turned on to output the clock signal CK as the first signal X when the control signal S is "Low" (the signal SB is "High"). Conversely, when the control signal S is "High" (the signal SB is "Low"), the first clocked inverter 11 is turned on to output the inverted signal of the clock signal CK as the first signal X.

The third transfer gate 20 is turned on to cause the signal inputted to the fourth inverter 18 to act as the control signal S when the signal Z is "Low" (the signal ZB is "High"). Conversely, when the signal Z is "High" (the signal ZB is "Low"), the second transfer gate 19 is turned on to cause the signal outputted from the fourth inverter 18 to act as the control signal S.

Figure 6:
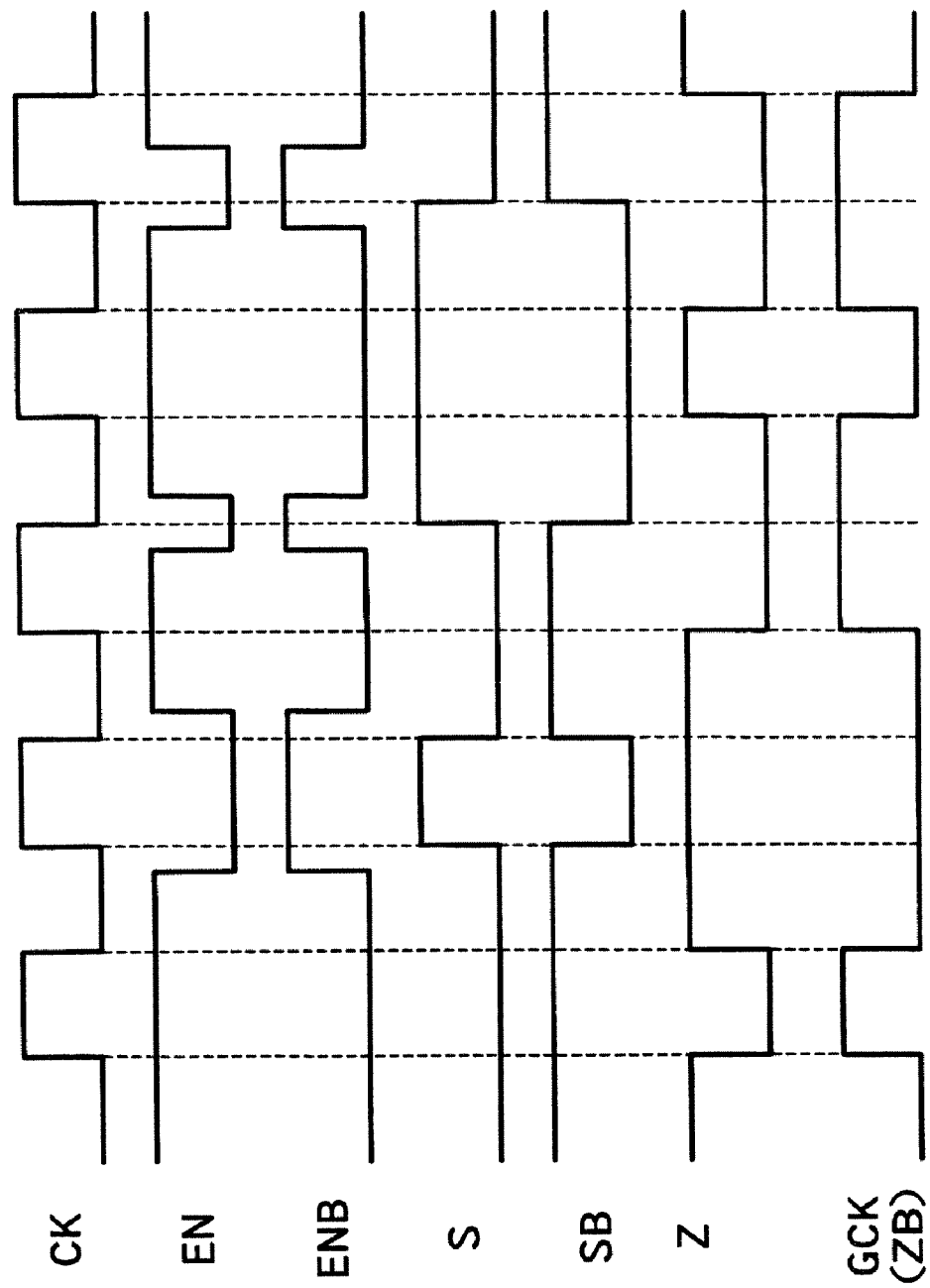
FIG. 6 is a timing chart showing an example of an ideal operation of the electronic circuit 300 according to the third embodiment of the present invention.

The operations of the electronic circuit 300 configured thus will be described below. FIG. 6 is a timing chart showing an example of an ideal operation of the electronic circuit 300 according to the third embodiment of the present invention.

1) As shown in FIG. 6, first, when the enable signal EN of the electronic circuit 300 is "High", the third clocked inverter 14 is turned off, the transfer gate 13 is turned on, and the output signal GCK changes with the change of the clock signal CK.

When the clock signal CK is "Low", the output of the first inverter 17 is "High" and the output of the fourth inverter 18 is "High". At this moment, when the signal Z inputted to the third inverter 16 is "High" (the output signal GCK is "Low"), the signal ZB outputted from the second inverter 15 is "Low", the second transfer gate 19 is turned on, and the control signal S is "High" (the signal SB is "Low").

Therefore, the first clocked inverter 11 is turned on and the outputted first signal X is "High". Since the first transfer gate 13 is turned on, the output of the first clocked inverter 11 and the input of the second inverter 15 are brought into conduction, the signal Z is set at "High", and the state of the signal Z is latched (non-inverted clock output state).

When the signal Z inputted to the third inverter 16 is "Low" (the output signal GCK is "High"), the signal ZB outputted from the second inverter 15 is "High", the third transfer gate 20 is turned on, and the control signal S is "Low" (the signal SB is "High").

Therefore, the second clocked inverter 12 is turned on and the first signal X is "Low". Since the first transfer gate 13 is turned on, the output of the second clocked inverter 12 and the input of the second inverter 15 are brought into conduction, the signal Z is set at "Low", and the state of the signal Z is latched (inverted clock output state).

2) Next, when the clock signal CK is "High", the output of the first inverter 17 is "Low" and the output of the fourth inverter 18 is "Low". At this moment, the first clocked inverter 11 is turned on and the first transfer gate 13 is turned on. Thus the output of the first clocked inverter 11 and the input of the second inverter 15 are both "Low" and the "High" output signal GCK is outputted to the output terminal 4. Furthermore, at this moment, the signal ZB (GCK) outputted from the second inverter 15 is "High", the third transfer gate 20 is turned on, the control signal S remains "High", and the state in which the first clocked inverter 11 is turned on (non-inverted clock output state) is latched. The same operation is performed for the inverted clock output state.

As described above, when the enable signal EN is "High", the output signal GCK continues to change with the change of the clock signal CK of the electronic circuit 300.

3) Next, when the enable signal EN is "Low", the signal ENB is "High", the first transfer gate 13 is turned off, and the third clocked inverter 14 is turned on, so that the latch function of the third clocked inverter 14 and the second inverter 15 is performed.

Thus the value of the signal Z of the input of the second inverter 15 is latched at a moment when the enable signal EN switches to "Low", and an inverted signal of the signal Z is continuously outputted to the output terminal 4 as the output signal GCK. In other words, while the enable signal EN is "Low", the output signal GCK does not change even when the clock signal CK changes.

4) The following will examine a moment when the enable signal EN changes from "Low" to "High". Also when the enable signal EN is "Low", the control signal S is changed such that the outputs of the first and second clocked inverters 11 and 12 and the input of the second inverter 15 agree with each other.

For example, the case where the input of the second inverter 15 is "High" will be examined below.

When the clock signal CK is "Low", the output of the first inverter 17 is "High", the input of the fourth inverter 18 is "Low", the output of the fourth inverter 18 is "High", the signal Z is "High" (the signal ZB is "Low"), and the second transfer gate 19 is turned on. Thus the control signal S is "High" (the signal SB is "Low"), the first clocked inverter 11 is turned on, and the output of the first clocked inverter 11 is "High".

When the clock signal CK is "High", the output of the first inverter 17 is "Low", the input of the fourth inverter 18 is "High", the output of the fourth inverter 18 is "Low", the signal Z is "High" (the signal ZB is "Low"), and the second transfer gate 19 is turned on. Thus the control signal S is "Low" (the signal SB is "High"), the second clocked inverter 12 is turned on, and the output of the second clocked inverter 12 is "High".

In other words, it is understood that the input of the second inverter 15 and the outputs of the first and second clocked inverters 11 and 12 agree with each other regardless of whether the clock signal CK is "High" or "Low".

A similar explanation can be given in the case where the input of the second inverter 15 is "Low".

As described above, the input of the second inverter 15 and the outputs of the first and second clocked inverters 11 and 12 agree with each other. Thus even at a moment when the enable signal EN changes from "Low" to "High", a value at that time is latched without being changed, the process returns to the state of 1), and the output signal GCK changes with the change of the clock signal CK.

As described above, the electronic circuit 300 can be configured such that the output signal GCK changes with the change of the clock signal CK when the enable signal EN is "High", and the immediately preceding value is latched when the enable signal EN is "Low".

As shown in FIG. 6, it is understood that only in a period during which the enable signal EN having the clock signal CK to be stopped is "Low" (an edge to be removed), the value of the output signal GCK does not change, and in a period during which the enable signal EN having the clock signal CK to be operated is "High", the output signal GCK changes with the change of the clock signal CK.

As described above, in the electronic circuit 300, it is possible to suppress only an edge to be removed on the clock signal CK. Thus it is possible to achieve an expected gating clock also in a clock system using a double edged memory, in which data transition on both of the rising edge and the falling edge is significant.

Also in the present embodiment, in consideration of a circuit delay, the processing speed of the input/output comparator 6 is set lower than the circuit delay of the non-inverted/inverted signal selector 2 and the signal latch 5 as in the second embodiment. Furthermore, when returning the signal latch 5 to the state in which the second signal (output signal) GCK is outputted in synchronization with the edge of the clock signal (input signal) CK, the enable signal is changed after the first signal X and the second signal (output signal) GCK agree with each other.

As described above, the electronic circuit of the present embodiment can perform clock gating corresponding to both edges of a clock while the circuit is simplified.

In the foregoing embodiments, the output signal GCK is latched when the enable signal EN is "Low". The present invention can be similarly applied to a circuit for latching the output signal GCK when the enable signal EN is "High".

Moreover, in the foregoing embodiments, the single clock signal is used. When an inverted clock is inputted, the skews of the non-inverted clock and the inverted clock can be aligned with each other with CTS (Clock Tree Synthesis). Thus it is possible to suppress fluctuations of a rising edge and a falling edge in a clock gating circuit, achieving a better clock system.

In the third embodiment, the non-inverted clock output state and the inverted clock output state were defined for the sake of simplification. However, in a clock system using a double edged memory, the presence of data transition (edge) on a rising edge and a falling edge is significant but whether an outputted clock is "High" or "Low" is not significant. Thus either a non-inverted clock or an inverted clock may be selected in the circuit.

What is claimed is:

1. An electronic circuit for performing clock gating on a clock signal supplied to a clock system using both edges, comprising:
    a non-inverted/inverted signal selector which has an input connected to an input terminal, is fed with the clock signal through the input terminal, and outputs a first signal obtained by non-inverting or inverting the clock signal in response to a control signal;
    a signal latch which has an input connected to an output of the non-inverted/inverted signal selector, outputs the inputted first signal as a second signal through an output terminal, and latches a state of the second signal in response to an enable signal inputted through an enable terminal; and
    an input/output comparator which compares the clock signal and the second signal and outputs the control signal to the non-inverted/inverted signal selector such that the first signal agrees with the second signal,
    wherein the non-inverted/inverted signal selector includes an inverter which has an input connected to the input terminal, and a multiplexer which has a first input connected to the input terminal and a second input connected to an output of the inverter, switches signals inputted to the first input and the second input in response to the control signal inputted to a selecting/input terminal, and outputs the first signal,
    the signal latch includes a latch circuit which has a D input connected to an output of the multiplexer and a G input connected to the enable terminal, outputs the inputted first signal as the second signal through the output terminal, and latches the state of the second signal in response to the enable signal inputted through the enable terminal, and
    the input/output comparator includes an exclusive-OR circuit which has one input connected to the input terminal, the other input connected to the output terminal, and an output connected to the selecting/input terminal of the multiplexer, and compares the clock signal and the second signal to output the control signal such that the first signal agrees with the second signal.

2. The electronic circuit according to claim 1, wherein the input/output comparator has a processing speed lower than a circuit delay of the non-inverted/inverted signal selector and the signal latch.

3. The electronic circuit according to claim 2, wherein when the signal latch is returned to a state in which the second signal is outputted in synchronization with an edge of the clock signal, the enable signal is changed after the first signal and the second signal agree with each other.

4. The electronic circuit according to claim 1, wherein when the signal latch is returned to a state in which the second signal is outputted in synchronization with an edge of the clock signal, the enable signal is changed after the first signal and the second signal agree with each other.

* * * * *